(12) United States Patent
Shih

(10) Patent No.: US 8,575,683 B1
(45) Date of Patent: Nov. 5, 2013

(54) SEMICONDUCTOR DEVICE AND METHOD OF FABRICATING THE SAME

(75) Inventor: Ping-Chia Shih, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/472,499

(22) Filed: May 16, 2012

(51) Int. Cl.
*H01L 29/66* (2006.01)

(52) U.S. Cl.
USPC .......... 257/319; 257/306; 257/657; 257/774; 438/267; 438/286; 438/526

(58) Field of Classification Search
USPC ......................................... 257/319
See application file for complete search history.

(56) References Cited

U.S. PATENT DOCUMENTS

| | | | | | |
|---|---|---|---|---|---|
| 4,851,365 | A * | 7/1989 | Jeuch | | 438/257 |
| 5,202,272 | A * | 4/1993 | Hsieh et al. | | 438/301 |
| 5,420,057 | A * | 5/1995 | Bennett et al. | | 438/233 |
| 5,668,021 | A * | 9/1997 | Subramanian et al. | | 438/282 |
| 5,686,331 | A * | 11/1997 | Song | | 438/303 |
| 5,770,507 | A * | 6/1998 | Chen et al. | | 438/305 |
| 5,981,346 | A * | 11/1999 | Hopper | | 438/304 |
| 6,043,545 | A * | 3/2000 | Tseng et al. | | 257/408 |
| 6,100,142 | A * | 8/2000 | Liao | | 438/291 |
| 6,140,219 | A * | 10/2000 | Dennison | | 438/618 |
| 6,225,148 | B1 * | 5/2001 | Miyamoto et al. | | 438/151 |
| 6,245,626 | B1 * | 6/2001 | Chen et al. | | 438/305 |
| 6,291,354 | B1 * | 9/2001 | Hsiao et al. | | 438/701 |
| 6,297,136 | B1 * | 10/2001 | Son | | 438/592 |
| 6,307,226 | B1 * | 10/2001 | Dennison | | 257/296 |
| 6,399,451 | B1 * | 6/2002 | Lim et al. | | 438/303 |
| 6,423,634 | B1 * | 7/2002 | Wieczorek et al. | | 438/655 |
| 6,459,121 | B1 * | 10/2002 | Sakamoto et al. | | 257/315 |
| 6,462,375 | B1 * | 10/2002 | Wu | | 257/316 |
| 6,576,519 | B1 * | 6/2003 | Houston | | 438/286 |
| 6,759,320 | B2 * | 7/2004 | Becker | | 438/620 |
| 6,784,491 | B2 * | 8/2004 | Doyle et al. | | 257/346 |
| 6,803,276 | B2 * | 10/2004 | Kim et al. | | 438/257 |
| 6,831,325 | B2 * | 12/2004 | Lojek | | 257/315 |
| 6,939,764 | B2 * | 9/2005 | Chen et al. | | 438/258 |
| 6,979,617 | B2 * | 12/2005 | Lee | | 438/257 |
| 7,067,880 | B2 * | 6/2006 | Juengling et al. | | 257/345 |
| 7,129,143 | B2 * | 10/2006 | Park | | 438/305 |
| 7,262,093 | B2 * | 8/2007 | Wang | | 438/257 |
| 7,276,759 | B1 * | 10/2007 | Yu et al. | | 257/317 |
| 7,288,817 | B2 * | 10/2007 | Juengling et al. | | 257/345 |
| 7,301,196 | B2 * | 11/2007 | Ding | | 257/316 |
| 7,329,910 | B2 * | 2/2008 | Zahurak et al. | | 257/192 |
| 7,459,383 | B2 * | 12/2008 | Lai | | 438/588 |
| 7,485,917 | B2 * | 2/2009 | Fu et al. | | 257/315 |
| 7,557,004 | B2 * | 7/2009 | Ogawa et al. | | 438/266 |
| 7,572,702 | B2 * | 8/2009 | Yoon | | 438/267 |
| 7,601,598 | B2 * | 10/2009 | Juengling et al. | | 438/289 |

(Continued)

*Primary Examiner* — N Drew Richards
*Assistant Examiner* — Ankush Singal
(74) *Attorney, Agent, or Firm* — Winston Hsu; Scott Margo

(57) ABSTRACT

A method of fabricating a semiconductor device includes the following steps. At first, a semiconductor substrate is provided. A gate stack layer is formed on the semiconductor substrate, and the gate stack layer further includes a cap layer disposed thereon. Furthermore, two first spacers surrounding sidewalls of the gate stack layer is further formed. Subsequently, the cap layer is removed, and two second spacers are formed on a part of the gate stack layer. Afterwards, a part of the first spacers and the gate stack layer not overlapped with the two second spacers are removed to form two gate stack structures.

20 Claims, 4 Drawing Sheets

(56) References Cited

U.S. PATENT DOCUMENTS

| | | |
|---|---|---|
| 7,611,941 B1 | 11/2009 | Shum |
| 7,679,126 B2 * | 3/2010 | Jung .............................. 257/314 |
| 8,017,485 B2 * | 9/2011 | Cho et al. ...................... 438/288 |
| 8,263,467 B2 * | 9/2012 | Grupp et al. .................. 438/299 |
| 2003/0032273 A1 * | 2/2003 | Tseng ........................... 438/594 |
| 2004/0043573 A1 * | 3/2004 | Juengling et al. ............. 438/303 |
| 2004/0166641 A1 * | 8/2004 | Hung et al. ................... 438/279 |
| 2004/0197995 A1 * | 10/2004 | Lee et al. ...................... 438/257 |
| 2004/0248367 A1 * | 12/2004 | Shyu et al. .................... 438/257 |
| 2005/0095796 A1 * | 5/2005 | van Bentum et al. ......... 438/300 |
| 2005/0245028 A1 * | 11/2005 | Lee ............................... 438/257 |
| 2006/0019444 A1 * | 1/2006 | Lu et al. ........................ 438/257 |
| 2007/0063294 A1 * | 3/2007 | Bu et al. ........................ 257/408 |
| 2007/0105327 A1 * | 5/2007 | Kim et al. ..................... 438/305 |
| 2007/0145469 A1 * | 6/2007 | Yoon ............................. 257/316 |
| 2008/0199998 A1 * | 8/2008 | Chen et al. .................... 438/275 |
| 2008/0242026 A1 * | 10/2008 | Matsuzaki et al. ............ 438/264 |
| 2009/0061581 A1 * | 3/2009 | Tsai et al. ..................... 438/257 |
| 2009/0152616 A1 * | 6/2009 | Kim .............................. 257/321 |
| 2009/0186459 A1 * | 7/2009 | Chen ............................. 438/261 |
| 2009/0224306 A1 * | 9/2009 | Hayashi ........................ 257/316 |
| 2010/0270605 A1 * | 10/2010 | Choi et al. .................... 257/316 |
| 2010/0304556 A1 * | 12/2010 | Yin et al. ...................... 438/593 |
| 2010/0308392 A1 * | 12/2010 | Nagai ........................... 257/315 |
| 2011/0108930 A1 * | 5/2011 | Cheng et al. .................. 257/412 |

\* cited by examiner

SEMICONDUCTOR DEVICE AND METHOD OF FABRICATING THE SAME

BACKGROUND OF THE INVENTION

1. Field of the Invention

The present invention relates to a semiconductor device and a method of fabricating the same, and more particularly to a semiconductor device having three gates and a method of fabricating the same.

2. Description of the Prior Art

A flash memory is a non-volatile memory, which can preserve data within the memory even when an external power supply is off. Recently, because a flash memory is re-writable and re-erasable, it has been widely applied in the fabrication of electrical products, such as mobile phones, digital cameras, video players, personal digital assistants (PDA) or systems on a chip (SOC).

Please refer to FIG. 1, which is a cross sectional diagram illustrating a conventional flash memory cell. As shown in FIG. 1, the flash memory cell 10 includes a semiconductor substrate 12, a gate stack 14 disposed on the semiconductor substrate 12, and a select gate 20 disposed at a side of the gate stack 14. The gate stack 14 includes a floating gate 16 and a control gate 18. The floating gate 16, the control gate 18 and the select gate 20 are commonly made of polysilicon, and the dielectric layers 22/24/26 such as oxide layers are disposed between the gates for electric insulation. The flash memory cell 10 further includes a source region 28 and a drain region 30 disposed in the semiconductor substrate 12 at two sides of the gate stack 14, and a channel region 32 defined in the semiconductor substrate 12 between the source region 28 and the drain region 30. Furthermore, the dielectric layers 22 between the floating gate 16 and the semiconductor substrate 12 may serve as a tunneling oxide, and the hot electrons through the dielectric layers 22 get in or out of the floating gate 16, thereby achieving data accessing.

In the manufacturing process of the conventional flash memory cell 10, two spacer-shaped gate layers (not shown) are previously formed on both sides of the gate stack 14. Subsequently, a mask is used to cover one side of the gate stack, the select gate 20 above the drain region 30 for example, and a reactive-ion-etching (RIE) process is performed to remove the other side of the gate stack 14, the gate layer above the source region 28 for example, to complete the formation of structure of the flash memory cell 10. However, as the size of the flash memory cell 10 is reduced, after the reactive-ion-etching process is completed, some polysilicon residue may remain at the side of the gate stack 14, which is called stringer and referred as stringer R at the side S of the gate stack 14 above the source region 28 as shown in FIG. 1. The stringer R may adversely affect the electrical performances of the flash memory cell, provoke current leakage, and deteriorate the capability of preserving data of the flash memory cell. Consequently, how to avoid the formation of stringer is still an important issue in the field, in order to improve the performances of the flash memory cell.

SUMMARY OF THE INVENTION

An objective of the present invention is therefore to provide a semiconductor device having three gates and a method of fabricating the same in order to avoid the formation of stringer.

According to one exemplary embodiment of the present invention, a method of fabricating a semiconductor device includes the following steps. At first, a semiconductor substrate is provided. A gate stack layer is formed on the semiconductor substrate, and the gate stack layer further includes a cap layer disposed thereon. Two first spacers surrounding sidewalls of the gate stack layer are further formed. Subsequently, the cap layer is removed, and two second spacers are formed on a part of the gate stack layer. Afterwards, a part of the first spacers and the gate stack layer not overlapped with the two second spacers are removed to form two gate stack structures.

According to another exemplary embodiment of the present invention, a semiconductor device is provided. The semiconductor device includes a semiconductor substrate and at least a gate structure disposed on the semiconductor substrate. The gate structure includes a first gate, a second gate and a top cap layer stacked sequentially on the semiconductor substrate, the top surface of the top cap layer is not parallel to the semiconductor substrate, and the gate structure further includes a third gate disposed at a side of the first gate and the second gate.

The cap layer is first used in the present invention to increase the original height of the first spacer, and the first spacer can further be used to define the size and the location of the later formed second spacers. Subsequently, the second spacers may serve as a mask in the following etching process, so that the three gates of each of the gate structures can be formed through self-aligned processes. Accordingly, the cost of the mask can be reduced, and the formation of stringer on a side of each of the gate structures can be effectively avoided.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
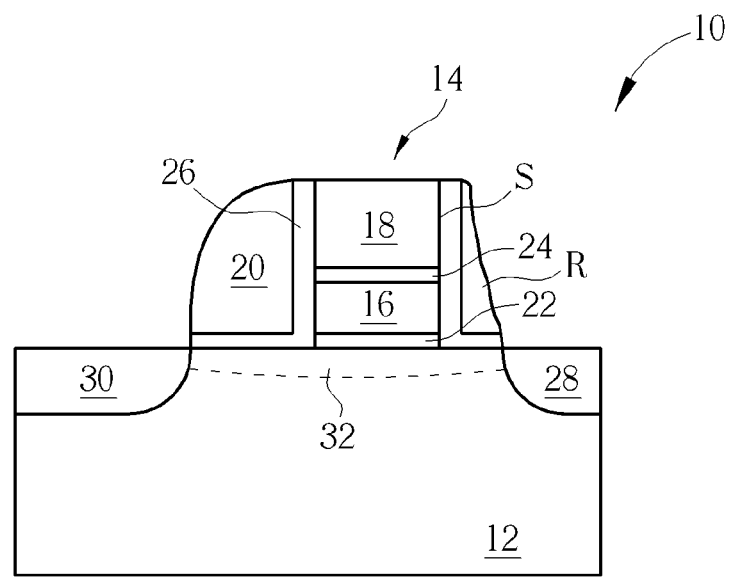
FIG. 1 is a cross sectional diagram illustrating a conventional flash memory cell.
Figure 2:
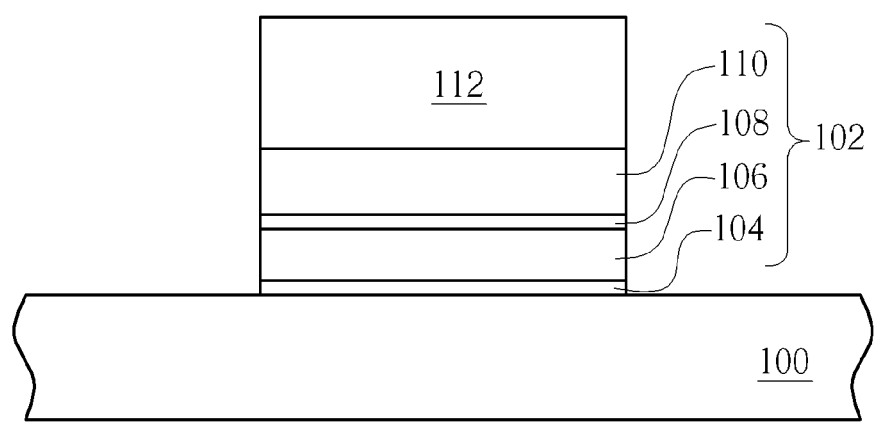
FIG. 2 through FIG. 7 are schematic diagrams illustrating a method of fabricating a semiconductor device according to a preferred exemplary embodiment of the present invention.

The present invention provides a method of fabricating a semiconductor device. Please refer to FIG. 2 through FIG. 7, which are schematic diagrams illustrating a method of fabricating a semiconductor device according to a preferred exemplary embodiment of the present invention. As shown in FIG. 2, a semiconductor substrate 100 is provided, and a gate stack layer 102 is formed on the semiconductor substrate 100. The semiconductor substrate 100 includes a substrate composed of Si, AsGa, silicon on insulator (SOI) layer, epitaxial layer, SiGe layer or other semiconductor materials. The gate stack layer 102 includes at least a gate layer and at least a dielectric layer. In this exemplary embodiment, the gate stack layer 102 includes a first dielectric layer 104, a first gate layer 106, a second dielectric layer 108 and a second gate layer 110 disposed in that order on the semiconductor substrate 100. Moreover, the gate stack layer 102 further includes a cap layer 112 disposed on the semiconductor substrate 100.

The method of forming the gate stack layer 102 and the cap layer 112 includes the following steps. At first, a stack layer (not shown) including a dielectric layer, a gate layer, a dielectric layer, a gate layer, and a material layer are disposed sequentially on the semiconductor substrate 100. The dielectric layers may be made of insulating materials such as silicon oxide, silicon oxynitride, or other high-k gate dielectric layers with a dielectric constant larger than 4. The gate layers may be made of conductive materials such as polysilicon, metal silicide or metal layer with specific work functions. Furthermore, the material layer may be made of insulating materials such as silicon nitride, silicon oxide, or silicon oxynitride. In this exemplary embodiment, the dielectric layers are made of silicon oxide formed through a thermal oxidation process or a deposition process such as a chemical vapor deposition (CVD) process or an atomic layer deposition (ALD) process; the gate layers are made of polysilicon formed through a low pressure chemical vapor deposition (LPCVD) process; and the cap layer is made of silicon nitride formed through a chemical vapor deposition (CVD) process, but not limited thereto. Subsequently, a patterned photoresist layer is formed on the material layer, and an etching process is performed to remove a part of the gate stack layer to form the gate stack layer 102 and the cap layer 112. The etching process may include the following steps. For example, the patterned photoresist layer is used as a mask. Then a part of the dielectric layers, a part of the gate layers and a part of the material layer are removed at the same time. Then, the patterned photoresist layer is removed. Additionally, in other ways, the patterns of the patterned photoresist layer may be previously transferred in the material layer, and the patterned material layer is used as a mask to remove a part of the dielectric layers and a part of the gate layers. It is noted that, the cap layer 112 is used as a hard mask in the lithography process; therefore, a width of the cap layer 112 is substantially equal to a width of the gate stack layer 102. In other words, the first dielectric layer 104, the first gate layer 106, the second dielectric layer 108, the second gate layer 110 and the cap layer 112 have the same width.

Figure 3:
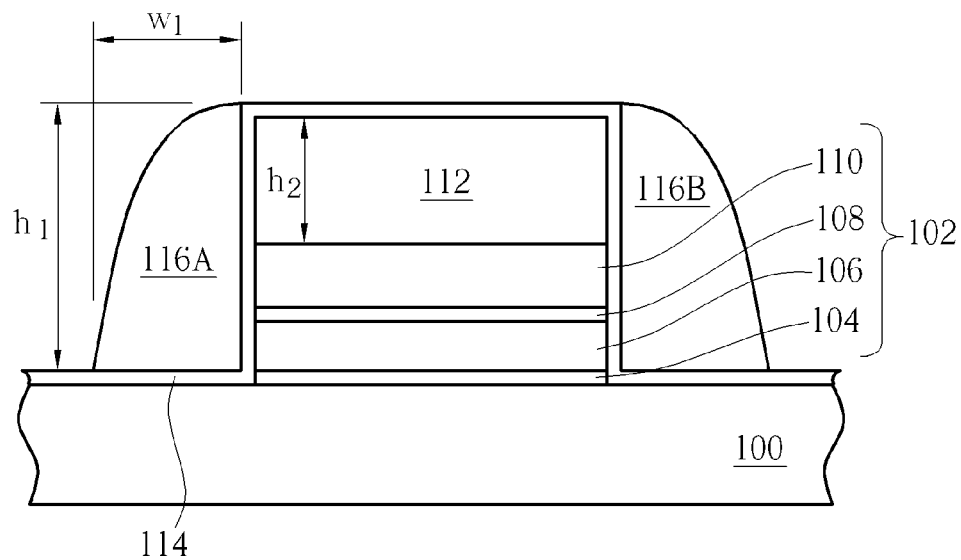

As shown in FIG. 3, a dielectric layer 114 is conformally formed on the semiconductor substrate 100, and the dielectric layer 114 on the cap layer 112 may cover the top of the cap layer 112, the sidewalls of the cap layer 112 and the sidewalls of the gate stack layer 102. The dielectric layer 114 may be a single layer or a composite layer made of insulating material. Furthermore, a conductive layer (not shown) is conformally formed on the dielectric layer 114. An anisotropic etching process, such as reactive-ion-etching (RIE) process is further performed to remove a part of the conductive layer to entirely expose the overall dielectric layer 114 on the gate stack layer 102 and the cap layer 112, and two first spacers 116A/116B are formed with the remaining conductive layer. The first spacers surround the opposite sidewalls of the gate stack layer 102, i.e. the first spacers 116A/116B surround the gate stack layer 102 and the cap layer 112. More precisely, a height h2 of the cap layer 112 is proportional to a height h1 of each of the first spacer 116A/116B. In other words, under similar etching process conditions, such as the etchant having the same selectivity, or having the same etching period, an increase of the height h2 of the cap layer 112 may leave more remaining conductive layer after the anisotropic etching process, and an original height h1 and a bottom width w1 of the formed first spacer 116A/116B may increase as well. In this exemplary embodiment, the conductive layer used for forming the first spacers 116A/116B may include conductive material such as polysilicon, but not limited thereto. In other exemplary embodiments, the first spacers 116A/116B may be made of insulating material in order to be used in other kinds of semiconductor processes.

Figure 4:
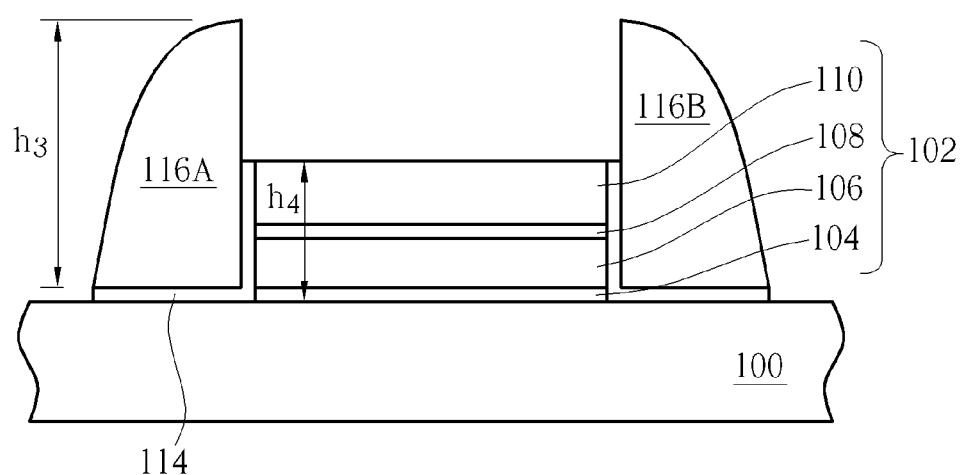

As shown in FIG. 4, the cap layer 112 on the gate stack layer 102 is removed. As the cap layer 112 is made of silicon nitride, a wet etching process is performed to remove the overall cap layer 112 and the dielectric layer 114 on the gate stack layer 102 to expose the top of the gate stack layer 102, i.e. the second gate layer 110, and the first spacers 116A/116B surrounding the sidewalls of the gate stack layer 102 is kept. The etchant preferably has selectivity to a material of the first spacers 116A/116B, such as polysilicon, and the heated phosphoric acid can serve as the etchant herein. Furthermore, after removing the cap layer 112, a height h3 of each of the remaining first spacer 116A/116B is still substantially larger than a height h4 of the gate stack layer 102. The method of removing the cap layer 112 is not limited thereto, and other methods of removing the overall cap layer 112, while still keeping the height h3 of each of the first spacer 116A/116B substantially larger than the height h4 of the gate stack layer 102, are also applicable in the present invention.

Figure 5:
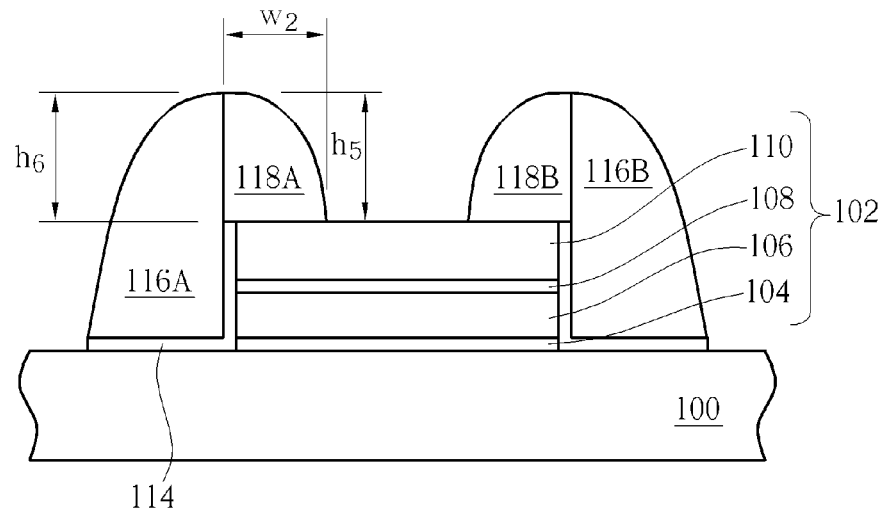

As shown in FIG. 5, two second spacers 118A/118B are formed on a part of the gate stack layer 102, that is, the formed second spacers 118A/118B do not entirely overlap the gate stack layer 102. The method for forming the second spacers 118A/118B after removing the cap layer 112 includes the following steps. A material layer (not shown) is conformally formed on the semiconductor substrate 100, and the material layer covers the gate stack layer 102 and the first spacer 116A/116B. Preferably, an etching selectivity is achieved between a material of the material layer and the material of the first gate layer 106/the second gate layer 110/the first spacer 116A/116B; in other words, as an etchant is used in the etching process, an etching rate of the material layer is preferably different from an etching rate of the first gate layer 106/the second gate layer 110/the first spacer 116A/116B. The material layer may be made of insulating material such as silicon nitride or silicon oxide. Subsequently, an etching process such as an anisotropic etching process is performed to remove a part of the material layer to expose the first spacers 116A/116B and a part of the top of the gate stack layer 102. In this exemplary embodiment, each of the second spacers 118A/118B has the same height h5 relative to the top of the gate stack layer 102 and the same bottom width w2. Each of the second spacers 118A/118B directly contact the corresponding first spacer 116A/116B, and the height h5 of each of the second spacers 118A/118B relative to the top of the gate stack layer 102 is substantially equal to a height h6 of each of the first spacer 116A/116B relative to the top of the gate stack layer 102, i.e. relative to the semiconductor substrate 100 and a peak of each of the second spacers 118A/118B has a height equal to a height of a peak of each of the first spacer 116A/116B. More specifically, under similar etching process conditions, the size of the second spacer 118A/118B and the overlapped area between the second spacer 118A/118B and the gate stack layer 102 are corresponding to the height of the first spacer 116A/116B. With the increase of the height h6 of the first spacer 116A/116B, the height h5 and the bottom width w2 of each of the formed second spacer 118A/118B may increase as well.

Figure 6:
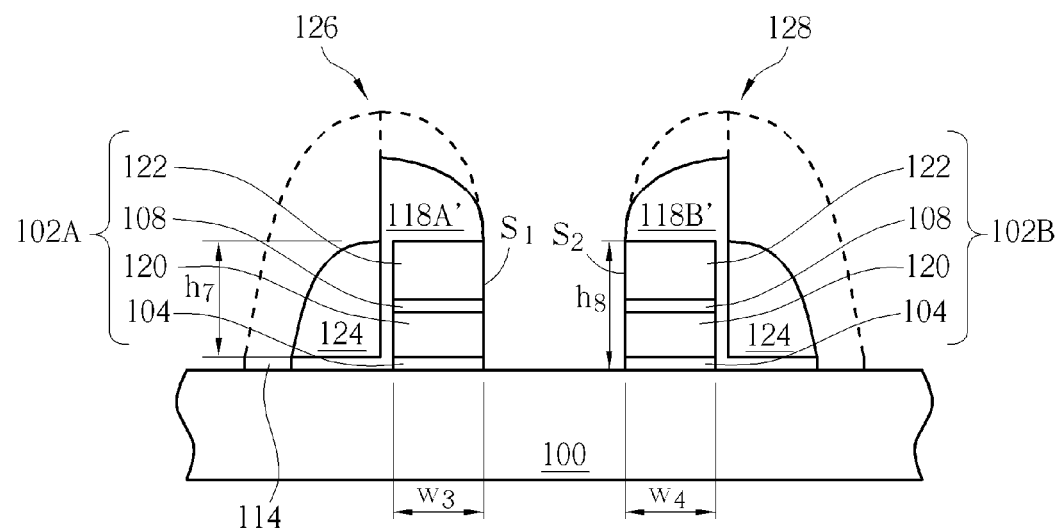

As shown in FIG. 6, an etching process such as a dry etching process is performed to remove a part of the first spacers 116A/116B to form a third gate 124, and simultaneously remove the gate stack layer 102 not overlapped with the second spacers 118A/118B to form the two gate stack structures 102A/102B, and each of the gate stack structures 102A/102B respectively includes a first gate 120 and a second gate 122. A height h7 of the formed third gate 124 is preferably substantially equal to a height h8 of each of the gate stack structures 102A/102B. Furthermore, the second spacers 118A/118B are partially removed through this etching process, in the preferred exemplary embodiments, the remaining second spacers 118A'/118B' respectively disposed on the gate stack structures 102A/102B may have a surface not parallel to the semiconductor substrate 100. The remaining second spacers 118A'/118B' could be selectively kept on the second gate 122 without additional removing process according to the process demands.

Please refer to FIG. 5 and FIG. 6 again, it is appreciated that, the second spacers 118A/118B are used as mask in the illustrated etching process, the gate stack layer 102 not overlapped with the second spacers 118A/118B and a part of the first spacers 116A/116B may be removed, and a first gate structure 126 and a second gate structure 128 are formed. The first gate structure 126 and the second gate structure 128 respectively include the first gate 120, the second gate 122 and the third gate 124. A width of the exposed top of the gate stack layer 102 may substantially be equal to an interval between the first gate structure 126 and the second gate structure 128. More specifically, in the present invention, the second spacers 118A/118B can be substitute for the photomask to define the locations of the first gate structure 126 and the second gate structure 128. Accordingly, the cost of the mask used during the manufacturing process can be reduced, and a smaller line width may be obtained. Moreover, by using the second spacers 118A/118B as masks, the gate structures having the same width could be formed simultaneously through a self-aligned process. In other words, the bottom width of the second spacer 118A'/118B' may be substantially equal to a bottom width w3/w4 of the gate stack structure 102A/102B, and the second spacers 118A'/118B' and the third gate 124 could jointly define the channel length between the first gate structure 126 and the second gate structure 128. The third gate 124 is only formed at a side of the gate stack structure 102A/102B, therefore, there is no conductive layer, such as additional spacers left between the first gate structure 126 and the second gate structure 128. Accordingly, the etching process performed to remove the remaining conductive layers can be omitted, and the formation of stringers made of conductive material on the sides S1/S2 between the first gate structure 126 and the second gate structure 128 may be avoided, which may further improve the electrical performances and the yield of the semiconductor device.

Figure 7:
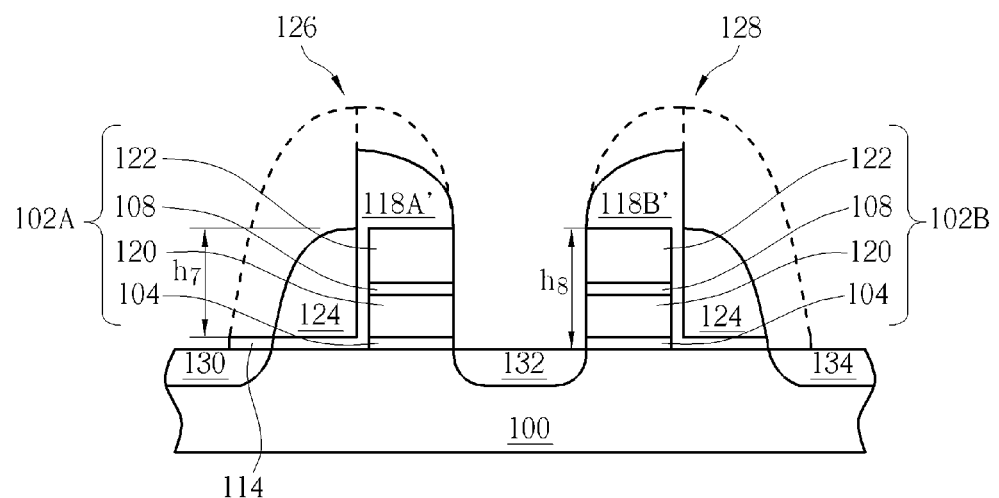

As shown in FIG. 7, an ion implantation process is performed, and the first gate structure 126 and the second gate structure 128 are used as masks. Accordingly, the source/drain regions 130/132/144 are respectively formed in the semiconductor substrate 100 at two sides of each of the first gate structure 126 and the second gate structure 128. In this exemplary embodiment, the source/drain region 132 can serve as a common source region for the first gate structure 126 and the second gate structure 128, which may reduce the occupied area of the semiconductor device, and facilitate the increase of the integration rate of the semiconductor device.

Figure 8:
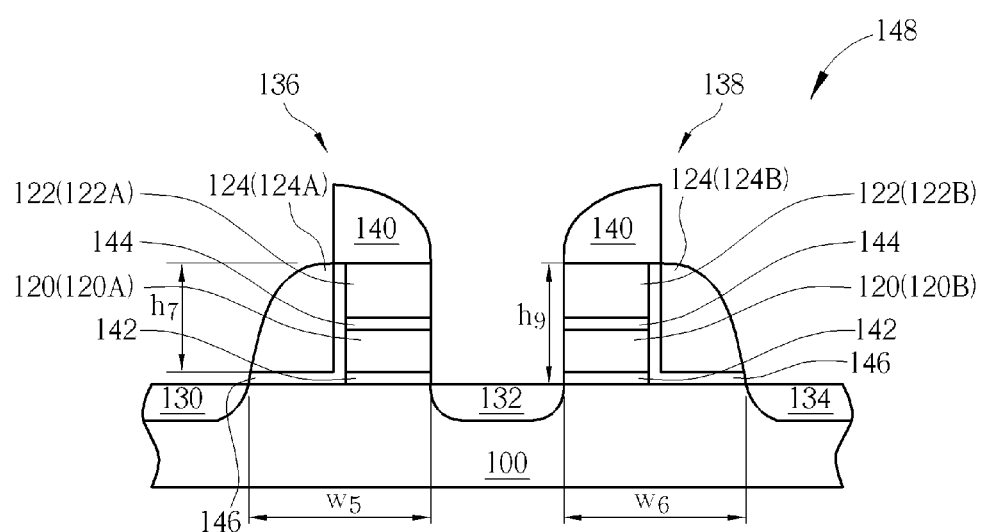
FIG. 8 is a schematic diagram illustrating a semiconductor device according to a preferred exemplary embodiment of the present invention.

The present invention also provides a semiconductor device. To simplify the explanation, the same components are referred to by using the same numerals as before in the following exemplary embodiments and only the differences are discussed while the similarities are not mentioned again. Please refer to FIG. 8, which is a schematic diagrams illustrating a semiconductor device according to a preferred exemplary embodiment of the present invention. As shown in FIG. 8, the semiconductor device 148 includes a semiconductor substrate 100 and at least a gate structure disposed on the semiconductor substrate 100. In this exemplary embodiment, the first gate structure 136 and the second gate structure 138 respectively include a first gate 120, a second gate 122 and a top cap layer 140 stacked sequentially on the semiconductor substrate 100, and the top surface of the top cap layer 140 is not parallel to the semiconductor substrate 100. Moreover, the first gate structure 136 and the second gate structure 138 further include a third gate 124 disposed at a side of the first gate 120 and the second gate 122 respectively. The first gate 120, the second gate 122 and the third gate 124 are made of conductive material such as polysilicon, metal silicide or metal layer with specific work functions. The material of the top cap layer 140 may be selected from the anti-oxidation materials such as silicon nitride or silicon oxide. The first gate structure 136 is a symmetric reflection to the neighboring second gate structure 138, i.e. the first gate structure 136 and the second gate structure 138 have the same width w5/w6. Furthermore, the third gate 124 is spacer-shaped, the third gate 124A of the first gate structure 136 is disposed at the left of the first gate 120A and the second gate 122A, and the third gate 124B of the second gate structure 138 is disposed at the right of the first gate 120B and the second gate 122B. As the semiconductor device 148 is used as a flash memory cell for example, the first gate 120 may serve as a floating gate, the second gate 122 may serve as a control gate, and the third gate 124 may serve as a select gate. Additionally, according to other implications, the first gate 120 as floating gate could include material of silicon nitride in order to trap charges. A height h7 of the third gate 124 is preferably substantially equal to a height h9 of the top of the second gate 122. The top cap layer 140 directly contacting the top of the second gate 122 has a non-planar surface. In this exemplary embodiment, the top cap layer 140 has a spacer-shaped structure, and the arc surface of the top cap layer 140 and the arc surface of the third gate 124 in the same gate structure have opposite protruding directions.

The first gate structure 136 and the second gate structure 138 respectively include a first dielectric layer 142 disposed between the semiconductor substrate 100 and the first gate 120, a second dielectric layer 144 disposed between the first gate 120 and the second gate 122, and an L-shaped third dielectric layer 146 disposed between the third gate 124 and the first gate 120/the second gate 122/the semiconductor substrate 100. The first dielectric layer 142, the second dielectric layer 144 and the third dielectric layer 146 are made of insulating material such as silicon oxide, silicon oxynitride, or other high-k gate dielectric layers with a dielectric constant larger than 4. The first dielectric layer 142 may serve as a tunneling oxide, and the hot electrons through the first dielectric layer 142 get in and out of the first gate 120, thereby achieving data accessing. The second dielectric layer 144 and the third dielectric layer 146 may serve as oxide layer between gates for electrically insulating the first gate 120, the second gate 122 and the third gate 124 from each other. Furthermore, the source/drain regions 130/132/144 are respectively formed in the semiconductor substrate 100 at two sides of each of the first gate structure 136 and the second gate structure 138.

In conclusion, the cap layer is first used in the present invention to increase the original height of the first spacer, and the first spacer can further be used to define the size and the location of the later formed second spacers. Subsequently, the second spacers may serve as a mask in the following etching processes, so that the three gates of each of the gate structures can be formed through self-aligned process. Accordingly, the cost of the mask can be reduced, and the formation of stringer on a side of each of the gate structures can be effectively avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
   providing a semiconductor substrate;
   forming a gate stack layer on the semiconductor substrate, wherein the gate stack layer further comprises a cap layer disposed thereon;
   forming two first spacers surrounding the opposite sidewalls of the gate stack layer;
   removing the cap layer;
   forming two second spacers on a part of the gate stack layer; and
   simultaneously removing a part of the first spacers and the gate stack layer not overlapped with the second spacers to form two gate stack structures.

2. The method of fabricating a semiconductor device according to claim 1, wherein a width of the cap layer is substantially equal to a width of the gate stack layer.

3. The method of fabricating a semiconductor device according to claim 1, wherein the method for forming the first spacers comprises:
   forming a dielectric layer on the cap layer;
   forming a conductive layer on the dielectric layer; and
   removing a part of the conductive layer to entirely expose the dielectric layer on the gate stack layer.

4. The method of fabricating a semiconductor device according to claim 1, wherein the first spacers surround the gate stack layer and the cap layer.

5. The method of fabricating a semiconductor device according to claim 1, wherein removing the cap layer comprises performing a wet etching process.

6. The method of fabricating a semiconductor device according to claim 1, wherein after removing the cap layer and before forming two gate stack structures, a height of each of the first spacers is substantially larger than a height of the gate stack layer.

7. The method of fabricating a semiconductor device according to claim 1, wherein the method for forming the second spacers after removing the cap layer, comprises:
   forming a material layer on the semiconductor substrate; and
   removing a part of the material layer to expose the first spacers and a part of a top of the gate stack layer.

8. The method of fabricating a semiconductor device according to claim 1, wherein before removing a part of the first spacers, each of the second spacers directly contacts the corresponding first spacer.

9. The method of fabricating a semiconductor device according to claim 1, wherein a material of the first spacers comprises conductive material.

10. The method of fabricating a semiconductor device according to claim 1, wherein a material of the cap layer and a material of the second spacers comprise insulating material.

11. The method of fabricating a semiconductor device according to claim 3, wherein removing a part of the conductive layer comprises performing an anisotropic etching process.

12. The method of fabricating a semiconductor device according to claim 7, wherein removing a part of the material layer comprises performing an anisotropic etching process.

13. The method of fabricating a semiconductor device according to claim 8, wherein a height of each of the second spacers relative to a top of the gate stack layer is substantially equal to a height of each of the first spacers relative to the top of the gate stack layer.

14. The method of fabricating a semiconductor device according to claim 8, wherein the gate stack layer comprises at least a gate layer and at least a dielectric layer.

15. The method of fabricating a semiconductor device according to claim 14, wherein a material of the gate layer comprises conductive material.

16. A semiconductor device, comprising:
   a semiconductor substrate; and
   at least a gate structure disposed on the semiconductor substrate, wherein the gate structure comprises a first gate, a second gate and a top cap layer stacked sequentially on the semiconductor substrate, a top surface of the top cap layer is not parallel to the semiconductor substrate, and the gate structure further comprises a third gate disposed at a side of the first gate and the second gate, and the third gate is lower than the top cap layer.

17. The semiconductor device according to claim 16, wherein the gate structure further comprises:
   a first dielectric layer disposed between the semiconductor substrate and the first gate;
   a second dielectric layer disposed between the first gate and the second gate; and
   a L-shaped third dielectric layer disposed between the third gate and the first gate, between the third gate and the second gate, and between the third gate and the semiconductor substrate.

18. The semiconductor device according to claim 16, wherein the first gate comprises a floating gate, the second gate comprises a control gate, and the third gate comprises a select gate.

19. The semiconductor device according to claim 16, wherein the gate structure is a symmetric reflection to another neighboring gate structure.

20. The semiconductor device according to claim 16, wherein a height of the third gate is preferably substantially equal to a height of a top of the second gate.

* * * * *